(12) United States Patent
Ishikawa

(10) Patent No.: US 7,137,022 B2
(45) Date of Patent: Nov. 14, 2006

(54) TIMING ADJUSTMENT CIRCUIT AND SEMICONDUCTOR DEVICE INCLUDING THE SAME

(75) Inventor: Toru Ishikawa, Tokyo (JP)

(73) Assignee: Elpida Memory, Inc. (JP)

( * ) Notice: Subject to any disclaimer, the term of this patent is extended or adjusted under 35 U.S.C. 154(b) by 321 days.

(21) Appl. No.: 10/693,191

(22) Filed: Oct. 23, 2003

(65) Prior Publication Data

US 2004/0222828 A1    Nov. 11, 2004

(30) Foreign Application Priority Data

Oct. 25, 2002  (JP) .............................. 2002-311231

(51) Int. Cl.
*G06F 1/12*  (2006.01)

(52) U.S. Cl. ..................... 713/400; 713/400; 327/156; 327/158; 710/5

(58) Field of Classification Search ............... 713/400; 710/5; 398/98; 327/156, 158
See application file for complete search history.

(56) References Cited

U.S. PATENT DOCUMENTS

| | | | |
|---|---|---|---|
| 6,043,694 A * | 3/2000 | Dortu | 327/156 |
| 6,313,676 B1 * | 11/2001 | Abe et al. | 327/158 |
| 6,437,889 B1 * | 8/2002 | Davidson | 398/98 |
| 2001/0021953 A1 * | 9/2001 | Nakashima | 710/5 |

FOREIGN PATENT DOCUMENTS

| | | |
|---|---|---|
| JP | 10-112182 | 4/1998 |
| JP | 2000-163999 | 6/2000 |
| JP | 2001-298362 | 10/2001 |

* cited by examiner

*Primary Examiner*—Thomas Lee
*Assistant Examiner*—Sean Weinman
(74) *Attorney, Agent, or Firm*—Ostrolenk, Faber, Gerb & Soffen, LLP

(57) ABSTRACT

In order to compare a phase of an internal clock signal outputted from a clock driver with that of a data strobe signal from a data strobe output circuit driven by the internal clock signal, a selector is disposed to supply a data strobe signal instead of an external clock signal inputted into a phase comparison circuit. While the selector selects the data strobe signal, the selector, a replica circuit, and the phase comparison circuit operate as a phase advance/delay signal generation circuit to output a phase advance/delay signal indicating a timing deviation to an external output terminal.

8 Claims, 6 Drawing Sheets

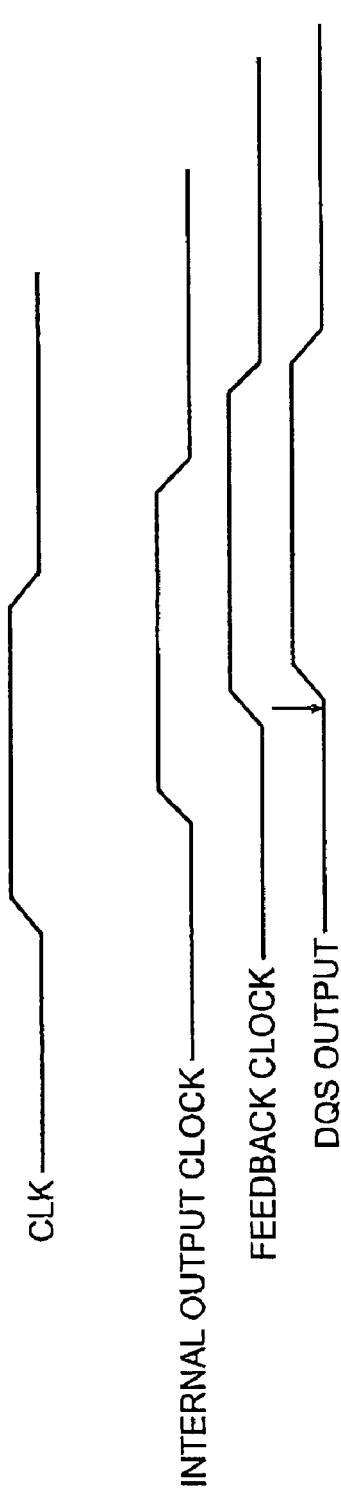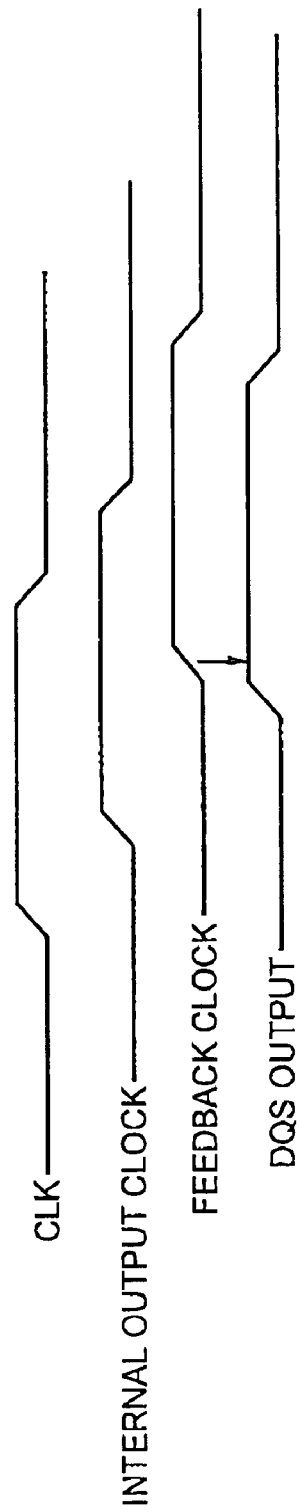
FIG. 4A
FIG. 4B

TIMING ADJUSTMENT CIRCUIT AND SEMICONDUCTOR DEVICE INCLUDING THE SAME

This application claims priority to prior application JP 2002-311231, the disclosure of which is incorporated herein by reference.

BACKGROUND OF THE INVENTION

The present invention relates to a timing adjustment circuit for producing an internal clock signal which has a predetermined phase relation with respect to an inputted external clock signal and to a semiconductor device including the timing adjustment circuit.

In semiconductor devices such as a synchronous memory which operates in synchronization with an external clock signal (clock synchronous type semiconductor memories such as SDRAM) and a controller (a system LSI or microprocessor), with speeding-up of the operation, a propagation delay of a clock signal in an apparatus has raised a problem. To solve the problem, in the conventional semiconductor device, a timing adjustment circuit is disposed in an interface (or an input/output device) to receive an external clock signal and to produce an internal clock which has the same phase as that of the external clock signal, or a predetermined phase difference.

Additionally, the semiconductor device has further been speeded up in recent years (frequency of the external clock has been increased). Accordingly, there has been a problem that a phase difference between the external clock signal and the internal clock signal deviates from a predetermined value (timing deviation). Specifically, with enhancement of an operation rate of the semiconductor device, an allowable range is narrowed with respect to the timing deviation, and a manufacturing fluctuation which is a cause for the timing deviation has raised a problem.

To solve such a problem, it has been proposed to compare the phase of the external clock signal with that of a data signal outputted from an output circuit in synchronization with the internal clock signal and to adjust a delay time of a replica circuit (or a dummy load) included in the timing adjustment circuit based on the comparison result (e.g., see Japanese Unexamined Patent Publication No. 2000-163999, pages 4–5, FIGS. 2, 5 and 7).

Referring to FIG. 1, description will be made of such a timing adjustment circuit. A timing adjustment circuit 50 includes: a clock input circuit 52 for receiving an external clock signal CLK supplied to an external clock input terminal 51 to output an input clock signal; a phase/delay adjustment circuit 53 including a delay locked loop (DLL) or a phase locked loop (PLL) for delaying the input clock signal from the clock input circuit 52; a clock driver 54 for receiving a delay input clock signal from the phase/delay adjustment circuit 53 to output the internal clock signal; a replica circuit 57 for generating a delay in accordance with a data output circuit 55 (or a data strobe output circuit 56) driven by the clock driver 54; and a phase comparison circuit 58 for comparing the phase of the output signal (feedback signal) of the replica circuit 57 with that of the external clock signal to output a comparison result to the phase/delay adjustment circuit 53. It is to be noted that the replica circuit 57 is constituted to be capable of adjusting the delay.

The timing adjustment circuit 50 produces the internal clock signal for defining a timing at which data is outputted from the data output circuit 55, and feedback-controls the delay of the phase/delay adjustment circuit 53 so that the phase of the feedback signal from the replica circuit 57 agrees with that of the external clock signal. At this time, when the phase of an output signal Dout of the data output circuit 55 agrees with that of the feedback signal, the phase/delay adjustment circuit 53 is feedback-controlled, and accordingly the phase of the output signal of the data output circuit 55 agrees with that of the external clock signal.

Additionally, when timing deviation exists in the timing adjustment circuit 50 by manufacturing fluctuation, and even when the phase/delay adjustment circuit 53 is feedback-controlled as described above, the phase of the output signal of the data output circuit 55 does not agree with that of the external clock signal CLK. In this case, the timing deviation by the manufacturing fluctuation is removed as follows.

First, "0" and "1" are alternately repeatedly outputted from the data output circuit 55 in synchronization with the internal clock signal. When the data strobe output circuit 56 is used, a data strobe signal is used as such.

Subsequently, a test apparatus (not shown) is used to detect the phase (rising edge) of the external clock signal CLK supplied to the external clock input terminal 51, and the phase (change point) of the output signal of the data output circuit 55 (or the data strobe output circuit 56) outputted to a data output terminal 59. Moreover, these phases are compared with each other, and the delay of the replica circuit 57 is adjusted based on a phase difference.

Then, the test apparatus is used again to compare the phases of the signals with each other so as to check whether the phase of the output signal of the data output circuit 55 agrees with that of the external clock signal.

Thereafter, the above-described operation is repeated until the phase of the output signal of the data output circuit 55 agrees with that of the external clock signal CLK.

Here, the replica circuit 57 will be explained. For example, the replica circuit 57 is constituted to be capable of changing the delay in accordance with a value stored in a register, or to be capable of changing the delay by disconnecting a fuse (one or a plurality of fuses in a fuse group). The replica circuit 57 further includes a switch for selecting one of the register and fuse (group). When the phases of two signals are compared with each other as described above while adjusting the delay of the replica circuit 57, the register is selected, and the value stored in the register is changed to adjust the delay. Further, when the phase of the output signal of the data output circuit 55 agrees with that of the external clock signal, the fuse is disconnected so as to realize the delay. Moreover, the switch is changed over to a fuse side from a register side to fix the delay of the replica circuit 57.

As described above, in the timing adjustment circuit 50 illustrated in FIG. 1, the problem of the timing deviation by the manufacturing fluctuation can be solved.

The above-described timing adjustment circuit 50 adjusts the output timing of the delay from the data output circuit 55, but a timing adjustment circuit for adjusting an input timing of a data input circuit is also disposed. One example of this timing adjustment circuit is shown in FIG. 2.

A timing adjustment circuit 60 illustrated in FIG. 2 includes: a clock input circuit 62 for receiving the external clock signal CLK supplied to an external clock input terminal 61 to output an input clock signal; a delay adjustment circuit 63 for delaying the input clock signal; and a clock driver 64 for receiving the delayed input clock signal to output the internal clock signal.

This timing adjustment circuit 60 produces the internal clock signal for defining the operation timing of a data input circuit 66 which latches the input data supplied to a delay input terminal 65. The phase of the data signal outputted from the data input circuit 66 may have a predetermined relation with that of the external clock signal CLK, and the phases do not have to necessarily agree with each other. Therefore, in the timing adjustment circuit 60, the feedback control is not performed as in the timing adjustment circuit 50 of FIG. 1.

In this timing adjustment circuit 60, the delay of the delay adjustment circuit 63 can be adjusted to remove the timing deviation. Specifically, the phase of the data signal outputted from the delay input circuit 61 is compared with that of the external clock signal CLK, the delay of the delay adjustment circuit 63 is adjusted so that the phase difference indicates a predetermined value, and thereby, the timing deviation is removed. For example, the delay adjustment circuit 63 is structured by a register, fuse, and switch in the same manner as in the replica circuit 57 of FIG. 1.

In the conventional timing adjustment circuit, in order to remove the timing deviation by the manufacturing fluctuation, two signals including the external clock signal and the output signal of the data output circuit or the data input circuit are detected, and the phases have to be compared with each other. In other words, a test apparatus including two pins (input terminals) is required for detecting two signals.

However, in a low-precision test apparatus for use in wafer tests, a skew between the pins is 1 ns or more, and is larger than the timing deviation (about 500 ps) allowed in a device, for example, which operates with an external clock of 500 MHz. Therefore, the conventional timing adjustment circuit cannot detect or remove the timing deviation using the low-precision test apparatus. That is, the conventional timing adjustment circuit has a problem that the circuit is limited by the skew between the pins in the test apparatus for use, when removing the timing deviation.

SUMMARY OF THE INVENTION

It is therefore an object of the present invention to provide a timing adjustment circuit which can eliminate a timing deviation with a high precision without being limited by a skew between pins of a test apparatus.

According to the present invention, there is provided a timing adjustment circuit including: an input circuit for outputting an external clock signal supplied from the outside as an input clock signal; a delay adjustment circuit for delaying the input clock signal from the input circuit to output a delayed input clock signal; and a clock driver for outputting an internal clock signal in response to the delayed input clock signal from the delay adjustment circuit, so as to determine delay of the delay adjustment circuit so that a phase of an output signal outputted from a circuit to be driven in synchronization with the internal clock signal has a predetermined relation with respect to that of the external clock signal, when the internal clock signal is used to drive the circuit to be driven. In the timing adjustment circuit, a phase advance/delay signal generation unit is disposed for using the internal clock signal and either one of the external clock signal and the output signal of the circuit to be driven to produce a phase advance/delay signal indicating whether the phase of the output signal from the circuit to be driven advances or delays with respect to the phase of the external clock signal.

Specifically, the above-described timing adjustment circuit further may include: a replica circuit for delaying a branched clock signal obtained by branching the internal clock signal to feedback-control the delay of the delay adjustment circuit; and a phase comparison circuit for comparing the phase of the output signal of the replica circuit with that of the external clock signal and outputting a comparison result to the delay adjustment circuit to adjust the delay of the delay adjustment circuit. In the timing adjustment circuit, as the replica circuit, a replica circuit which is capable of adjusting the delay is used. A selection circuit for selectively outputting either one of the external clock signal and the output signal from the circuit to be driven to the phase comparison circuit, and an external output unit for outputting an output of the phase comparison circuit to the outside are disposed. The selection circuit selects the output signal from the circuit to be driven to operate a combination of the selection circuit, the replica circuit, and the phase comparison circuit as the phase advance/delay signal generation unit, and the comparison result of the phase comparison circuit is supplied as the phase advance/delay signal to the external output unit.

Alternatively, in the timing adjustment circuit in which the delay adjustment circuit is constituted to be capable of changing a delay time, a circuit to be driven is a data input circuit for latching input data supplied from the outside in synchronization with the internal clock signal. The phase advance/delay signal generation unit includes the same constitution as that of the circuit to be driven and includes means for receiving the supply of the external clock signal instead of the input data and latching the external clock signal in synchronization with the internal clock signal to output the phase advance/delay signal to the outside.

According to the present invention, the phase advance/delay signal generation circuit is disposed in the timing adjustment circuit. Accordingly, it is possible to provide the semiconductor device in which the timing deviation can be removed with high precision without being influenced by the skew between the pins of the test apparatus and high-rate operation is possible.

BRIEF DESCRIPTION OF THE DRAWINGS

FIGS. 4A and 4B are timing charts of signals in the timing adjustment circuit of FIG. 3;

DESCRIPTION OF THE PREFERRED EMBODIMENT

Embodiments of the present invention will hereinafter be described in detail with reference to the drawings.

Figure 1:
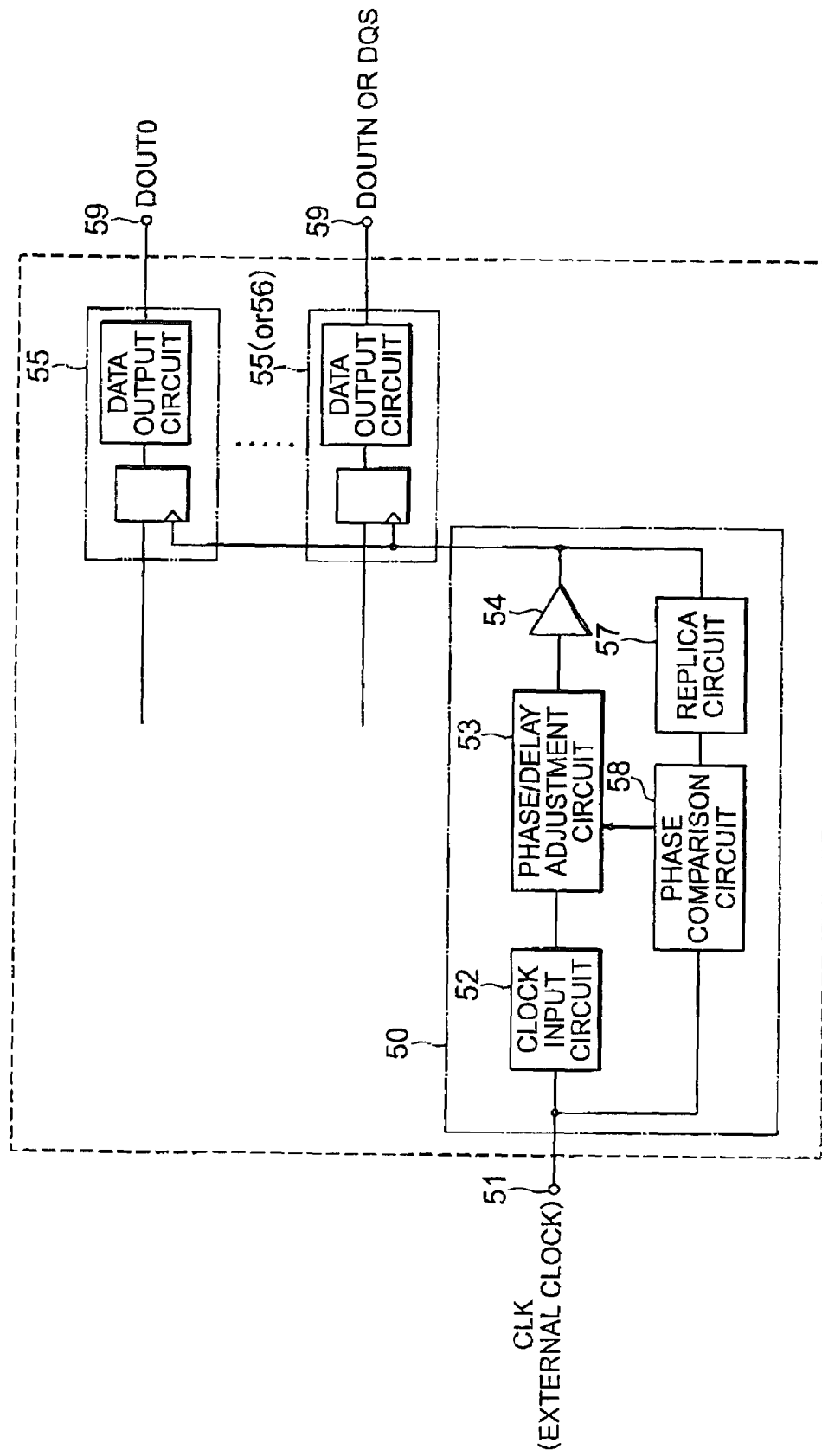
FIG. 1 is a block diagram of the semiconductor device including a conventional timing adjustment circuit.
Figure 3:
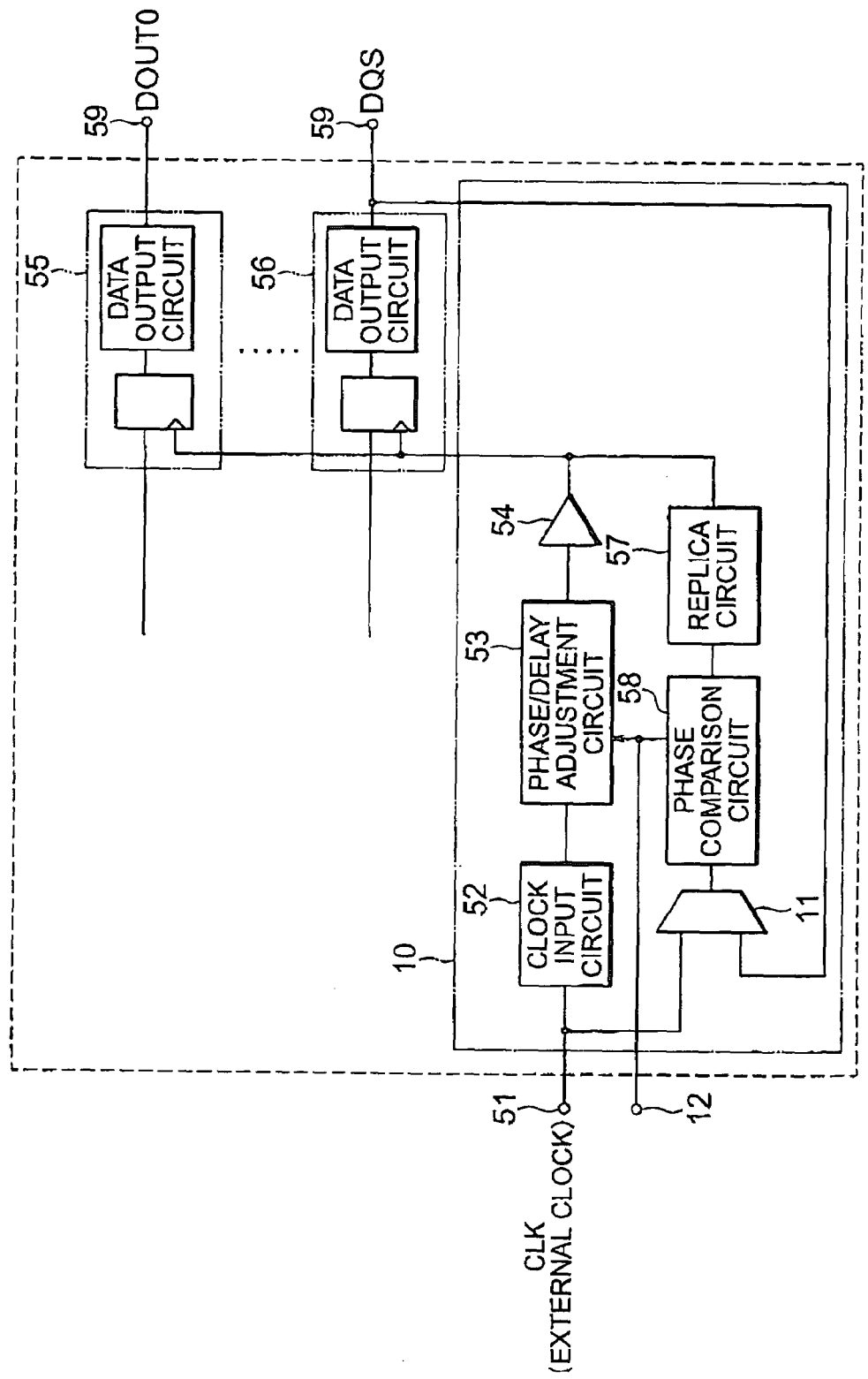
FIG. 3 is a block diagram of a semiconductor device including a timing adjustment circuit according to a first embodiment of the present invention.

FIG. 3 shows a block diagram of a timing adjustment circuit according to a first embodiment of the present invention. In addition to a constitution of a timing adjustment circuit 50 of FIG. 1, a timing adjustment circuit 10 includes a selector 11, and an external output terminal 12 for extracting an output of a phase comparison circuit 58 to the outside.

The selector 11 includes two input terminals, one of the input terminals is connected to an external clock input terminal 51, and the other is connected to an output terminal 59 of a data strobe output circuit 56. The output terminal of the selector 11 is connected to one input terminal of the phase comparison circuit 58. The selector 11 selectively outputs either one of an inputted external clock signal CLK and data strobe signal DQS to the phase comparison circuit 58.

Next, a method of removing (reducing) a timing deviation of the timing adjustment circuit of FIG. 3 will be described. When the timing deviation is removed, the selector 11 is set so as to selectively output the data strobe signal to the phase comparison circuit 58.

When the external clock signal CLK is given to the external clock input terminal 51, the external clock signal CLK is supplied to a clock input circuit 52 and the selector 11. As described above, the selector 11 is set to select the data strobe signal DQS and therefor, the external clock signal CLK is not supplied to the phase comparison circuit 58.

The clock input circuit 52 is, for example, an input buffer. When the external clock signal CLK is inputted into the circuit, the circuit outputs the signal as the input clock signal to a phase/delay adjustment circuit 53.

The phase/delay adjustment circuit 53 delays the input clock signal CLK, and outputs the signal as the delayed input clock signal to a clock driver 54. It is to be noted here that the phase/delay adjustment circuit 53 does not have to be locked for reasons described later.

The clock driver 54 receives the delayed input clock signal from the phase/delay adjustment circuit 53 to output the internal clock signal to the data strobe output circuit 56 and a replica circuit 57. Herein, the internal clock signal is outputted to a data output circuit 55, and therefore referred to also as an internal output clock.

The data strobe output circuit 56 outputs level "0" or "1" in synchronization with the internal clock signal so that the output constitutes a repetition (i.e., the data strobe signal) of the levels "0" and "1".

On the other hand, the replica circuit 57 delays the internal clock signal to output a feedback clock signal.

The data strobe signal DQS outputted from the data strobe output circuit 56 is supplied to one input of the phase comparison circuit 58 via the selector 11, and the feedback clock signal outputted from the replica circuit 57 is supplied to the other input of the phase comparison circuit 58. The phase comparison circuit 58 compares the phases of these two signals with each other to output the comparison result. Here, the data strobe signal DQS and feedback clock signal inputted into the phase comparison circuit 58 are both produced based on the internal clock signal. Therefore, even when the phase/delay adjustment circuit 53 is not locked, if the phases are compared with each other, a timing deviation of the timing adjustment circuit 10 can be detected.

A relation among an input timing of the external clock signal CLK, the internal clock signal (internal output clock), and output timings of the feedback clock signal and data strobe signal in the timing adjustment circuit 10 is shown in FIG. 4A or 4B.

As shown in FIG. 4A, when the feedback clock signal is ahead of the data strobe signal, the phase comparison circuit 58 outputs level "L" as the comparison result. As shown in FIG. 4B, when the feedback clock signal is behind the data strobe signal, the phase comparison circuit 58 outputs level "H" as the comparison result. The output from the phase comparison circuit 58 is outputted to the phase/delay adjustment circuit 53, and is also outputted as a phase advance/delay signal indicating advance/delay of the phase of the feedback clock signal to the external output terminal 12.

If a test apparatus is connected to the external output terminal 12 to detect the phase advance/delay signal and confirm the level of the signal, the advance/delay of the feedback signal with respect to the data strobe signal can be confirmed. In this case, since the signal to be detected is one, skew between pins of the test apparatus does not influence a detection result.

If the phase advance/delay signal confirmed with the test apparatus indicates the level "L", the delay of the replica circuit 57 is increased, and the feedback clock signal is further delayed. On the other hand, if the phase advance/delay signal indicates the level "H", the delay of the replica circuit 57 is reduced, and the feedback clock signal is advanced. In this manner, the delay of the replica circuit 57 is adjusted to realize such a state that the level of the phase advance/delay signal unstably fluctuates between "L" and "H". In this state, the phase of the feedback clock signal can be regarded as agreeing with that of the data strobe signal.

Thereafter, when the selector 11 is switched on the side of the external clock signal CLK, the delay of the phase/delay adjustment circuit is feedback-controlled so that the phase of the output of the data output circuit 55 agrees with that of the external clock signal.

As described above, in the timing adjustment circuit according to the present embodiment, a combination of the replica circuit 57, phase comparison circuit 58, and selector 11 is operated as a phase advance/delay signal generation circuit. Thereby, the timing deviation can be detected regardless of precision of the test apparatus. Specifically, in the timing adjustment circuit, the timing deviation can be detected without being influenced by the skew between the pins of the test apparatus, and a timing deviation of 500 ps or less can be removed (decreased). Further, this can realize a semiconductor device which operates with a clock of 500 MHz or more.

It is to be noted that in the above-described embodiment, the use of the data strobe signal outputted from the data strobe output circuit 56 has been explained. However, in case where the data strobe output circuit 56 is not disposed, the data output circuit 55 may be used in such a manner that "0" and "1" are alternately and repeatedly outputted from the data output circuit 55.

Subsequently, description will be made of a second embodiment of the present invention with reference to FIG. 5.

Figure 2:
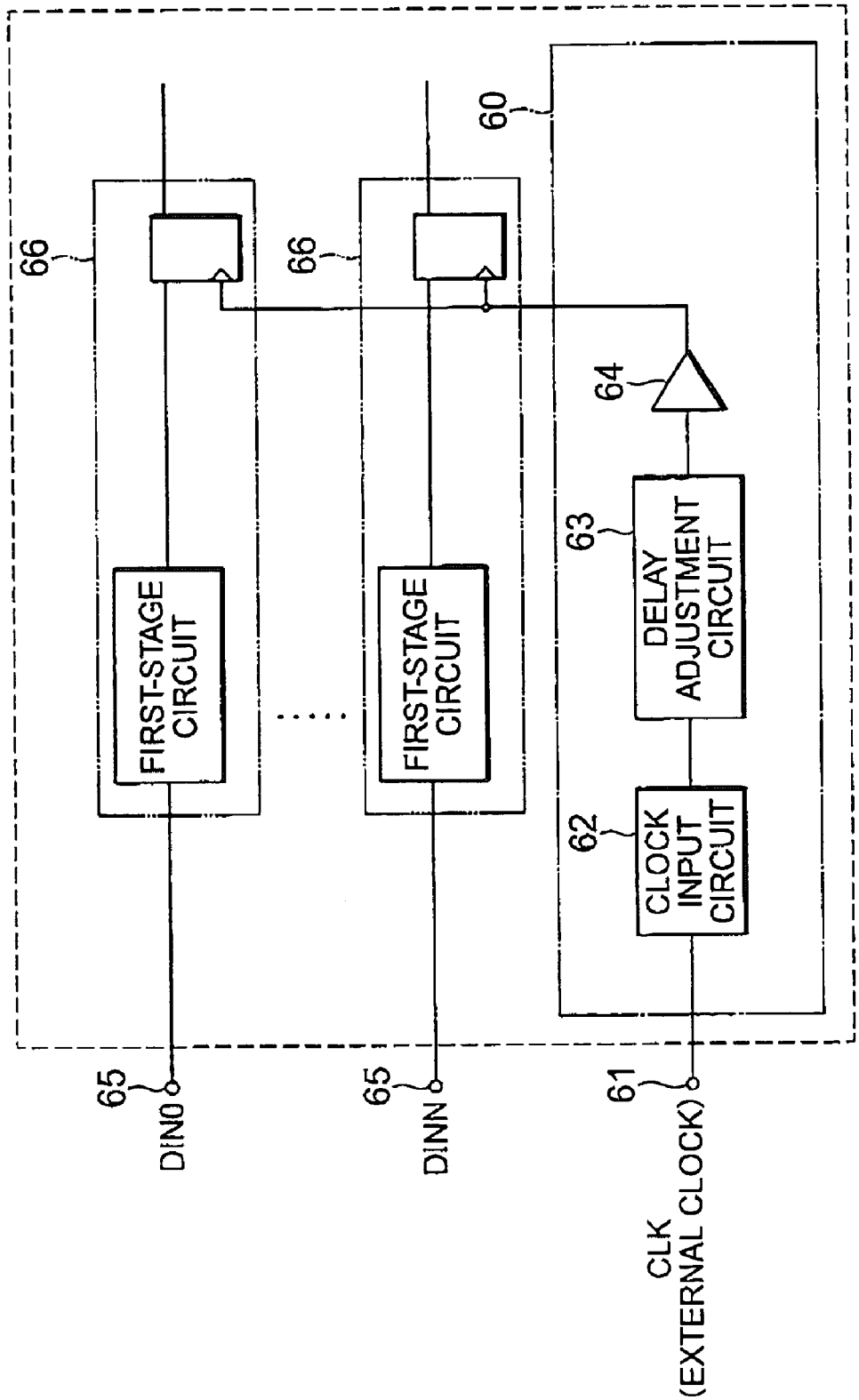
FIG. 2 is a block diagram of the semiconductor device including another conventional timing adjustment circuit.
Figure 5:
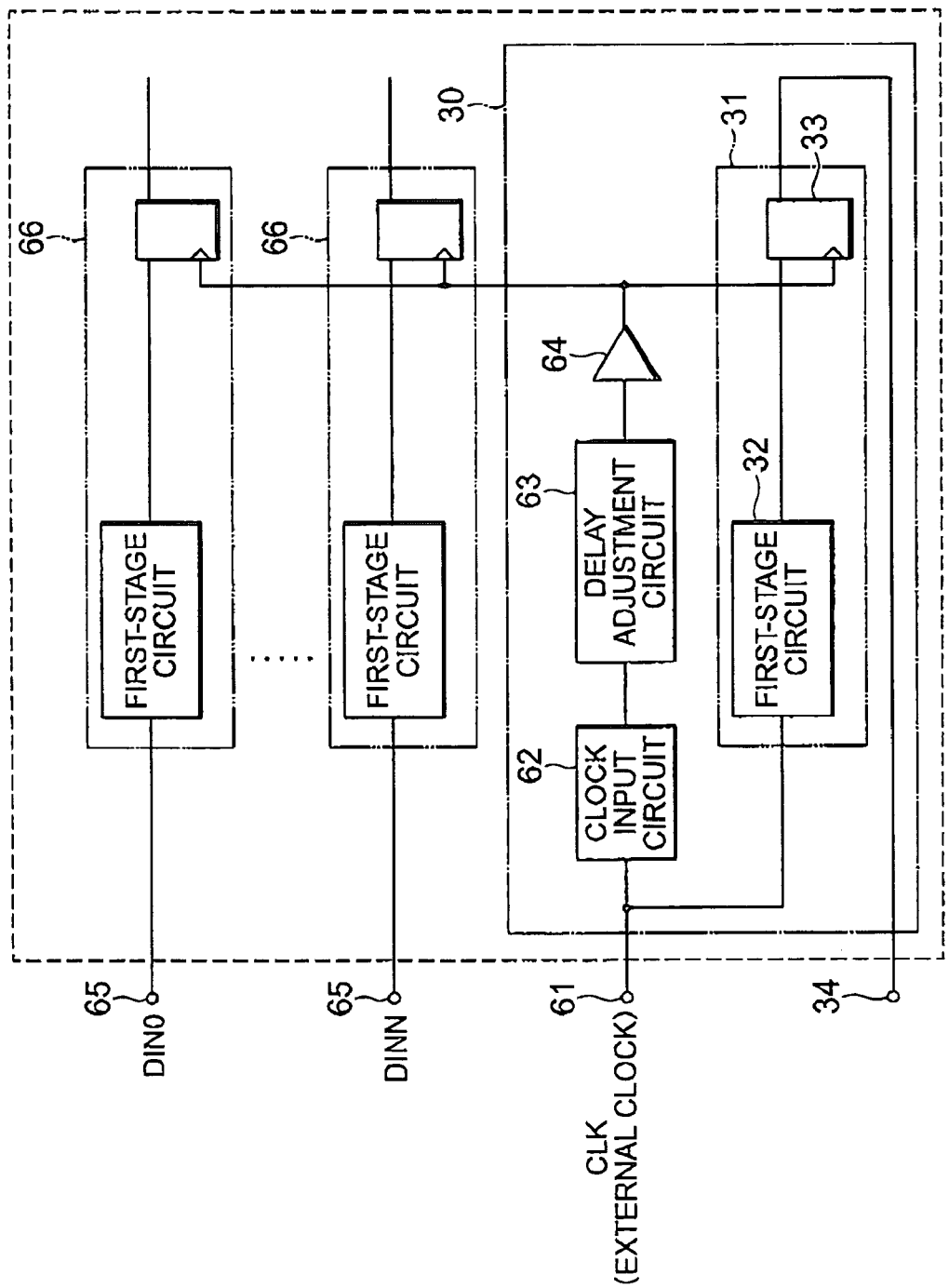
FIG. 5 is a block diagram of a semiconductor device including a timing adjustment circuit according to a second embodiment of the present invention.

In addition to the constitution of FIG. 2, a timing adjustment circuit 30 illustrated in FIG. 5 includes a replica circuit 31 including the same constitution as that of a data input circuit 66.

The replica circuit 31 includes an initial-stage circuit 32 and latch circuit 33, and is connected between an external clock input terminal 61 and an external output terminal 34. The latch circuit 33 is connected to a clock driver 64.

When a external clock signal CLK is inputted into the external clock input terminal 61 of the timing adjustment circuit 30 illustrated in FIG. 5, the external clock signal CLK is given to a clock input circuit 62 and replica circuit 31.

Upon receiving the external clock signal CLK, the clock input circuit 62 outputs the signal as the input clock signal to a delay adjustment circuit 63. The delay adjustment circuit 63 delays the external clock signal CLK to output the delayed input clock signal to the clock driver 64. The clock driver 64 receives the delayed input clock signal to produce the internal clock signal. It is to be noted that the internal clock signal is outputted also to the data input circuit 66, and is therefore referred to also as an internal input clock.

In the replica circuit 31, the initial-stage circuit which has received the external clock signal CLK outputs the signal as a reference clock signal to the latch circuit 33. The latch circuit 33 latches the reference clock signal from the initial-stage circuit 32 in synchronization with the internal clock signal from the clock driver 64 to produce the phase advance/delay signal to the external output terminal 34.

Figure 6A:
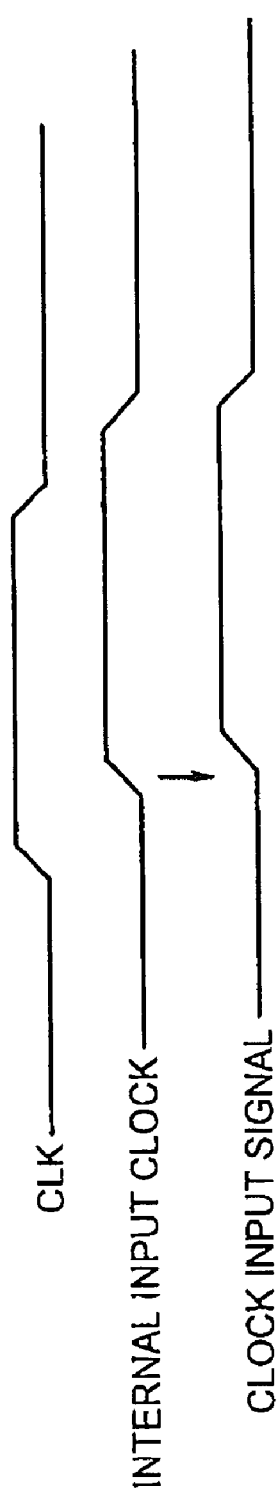
FIGS. 6A and 6B are timing charts of the respective signals in the timing adjustment circuit of FIG. 5.
Figure 6B:
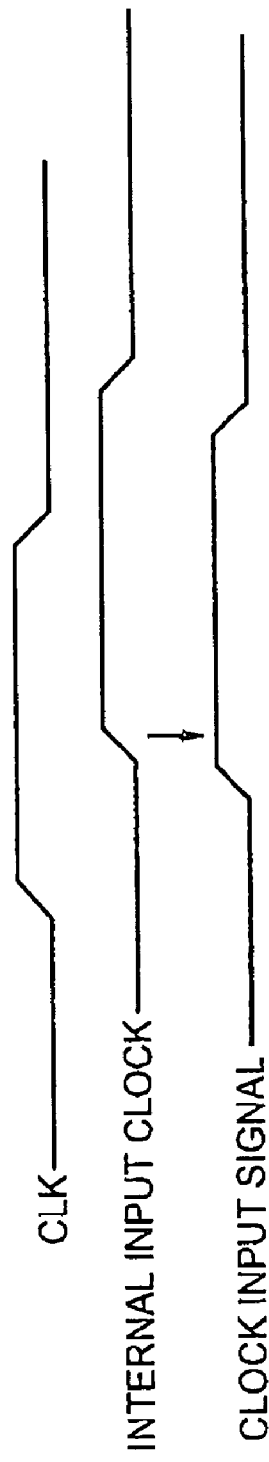

FIGS. 6A and 6B show a relation between the input timing of the external clock signal and the respective output timings of the internal clock signal (internal input clock) and the reference clock signal in the timing adjustment circuit 30.

As shown in FIG. 6A, when the internal clock signal is ahead of the reference clock signal, the output from the latch circuit 33, that is, the phase advance/delay signal indicates the level "L". On the other hand, when the internal clock signal is behind the reference clock signal, the output from the latch circuit 33, that is, the phase advance/delay signal indicates the "H" level. As a consequence, if the external output terminal 34 is connected to the test apparatus to detect the phase advance/delay signal and to confirm the level, it can be detected whether the internal clock signal advances or delays with respect to the reference clock signal.

In the same manner as the first embodiment, while checking the level of the phase advance/delay signal, the delay of the delay adjustment circuit 63 is adjusted. As a result of the adjustment, the phase advance/delay signal is brought in such a state that the signal unstably changes between the levels "H" and "L". Thereby, the phase of the internal clock signal is regarded as agreeing with that of the reference clock signal. As a consequence, the phase difference between the data signal from the data input circuit 66 and the external clock signal can be set to a predetermined value.

As described above, in the timing adjustment circuit according to the present embodiment, the replica circuit 31 is operated as the phase advance/delay signal generation circuit, and therefore, the timing deviation can be removed regardless of the precision of the test apparatus. Specifically, in the timing adjustment circuit, the timing deviation can be detected without being influenced by the skew between the pins of the test apparatus, and it is therefore possible to remove a timing deviation of 500 ps or less. This can realize a semiconductor device which operates with a clock of 500 MHz or more.

It is to be noted that both in the first and second embodiments, the production of the internal clock using the rising edge of the external clock signal has been described. However, even when the internal clock is produced using a falling edge of the external clock signal, the timing adjustment circuit of the present invention can be used. Needless to say, even with respect to the interface of the semiconductor device using both the rising and falling edges of the external clock signal as in SDRAM referred to as DDR, the timing adjustment circuit of the present invention can be used in accordance with the edges.

While the present invention has thus far been disclosed in conjunction with several embodiments thereof, it will be readily possible for those skilled in the art to put the present invention into practice various other manners.

What is claimed is:

1. A timing adjustment circuit, comprising:
an input circuit effective to receive an external clock signal and output an input clock signal;
a delay adjustment circuit effective to delay the input clock signal from the input circuit to output a delayed input clock signal; and
a clock driver effective to output an internal clock signal to a data output circuit in response to the delayed input clock signal from the delay adjustment circuit, so that a phase of an output signal outputted from the data output circuit has a predetermined relation with respect to that of the external clock signal,
a phase advance/delay signal generation unit, the phase advance/delay signal generating unit effective to selectively compare the internal clock signal and either one of the external clock signal and the output signal of the data output circuit to produce a phase advance/delay signal indicating whether the phase of the output signal of the data output circuit advances or delays with respect to the phase of the external clock signal;
a phase comparison circuit for comparing the phase of the output signal of the replica circuit with that of the external clock signal and outputting a comparison result to the delay adjustment circuit to adjust the delay of the delay adjustment circuit; and
an external output unit for outputting an output of the phase comparison circuit to the outside,
wherein the comparison result of the phase comparison circuit is supplied as the phase advance/delay signal to the external output unit.

2. The timing adjustment circuit according to claim 1, wherein:
the replica circuit is effective to delay the internal clock signal based on a change of a content held in a register or by disconnection of a fuse.

3. A semiconductor device, comprising:
an input circuit effective to receive an external clock signal and output an input clock signal;
a delay adjustment circuit effective to delay the input clock signal from the input circuit to output a delayed input clock signal; and
a clock driver effective to output an internal clock signal to a data output circuit in response to the delayed input clock signal from the delay adjustment circuit, so that a phase of an output signal outputted from the data output circuit has a predetermined relation with respect to that of the external clock signal; and
a phase advance/delay signal generation unit, the phase advance/delay signal generating unit effective to selectively compare the internal clock signal and either one of the external clock signal and the output signal of the data output circuit to produce a phase advance/delay signal indicating whether the phase of the output signal of the data output circuit advances or delays with respect to the phase of the external clock signal.

4. A semiconductor device, comprising:
an input circuit effective to receive an external clock signal and output an input clock signal;
a delay adjustment circuit effective to delay the input clock signal from the input circuit to output a delayed input clock signal; and
a clock driver effective to output an internal clock signal to a data output circuit in response to the delayed input clock signal from the delay adjustment circuit, so that a phase of an output signal outputted from the data output circuit has a predetermined relation with respect to that of the external clock signal; and a phase advance/delay signal generation unit, the phase advance/delay signal generating unit effective to selectively compare the internal clock signal and either one of the external clock signal and the output signal of the data output circuit to produce a phase advance/delay signal indicating whether the phase of the output signal of the data output circuit advances or delays with respect to the phase of the external clock signal;

a replica circuit effective to receive and delay the internal clock signal, the replica circuit being effective to delay the internal clock signal based on a change of a content held in a register or by disconnection of a fuse;

wherein the phase advance/delay signal generating unit compares the internal clock signal delayed by the replica circuit; and the phase advance/delay signal generating unit includes a selection circuit effective to selectively output either one of the external clock signal and the output signal from the data output circuit to the phase comparison circuit;

whereby when a tester is connected to monitor the phase advance/delay signal and the content held by the register is changed to obtain an appropriate delay time, the fuse may be disconnected so that a delay time of the semiconductor device can be fixed.

5. The timing adjustment circuit according to claim 1, wherein:

the data output circuit includes a latch effective to latch input data in synchronization with the internal clock signal, and the phase advance/delay signal generation unit includes a similar impedance as that of the data output circuit and is effective to receive the external clock signal and to latch the external clock signal in synchronization with the internal clock signal and for outputting the phase advance/delay signal to the outside.

6. The timing adjustment circuit according to claim 5, wherein:

the delay adjustment circuit is effective to delay the input clock signal by change of a content held by a register or by disconnection of a fuse.

7. A semiconductor device, comprising:

an input circuit effective to receive an external clock signal and output an input clock signal;

a delay adjustment circuit effective to delay the input clock signal from the input circuit to output a delayed input clock signal; and a clock driver effective to output an internal clock signal to a data output circuit in response to the delayed input clock signal from the delay adjustment circuit, so that a phase of an output signal outputted from the data output circuit has a predetermined relation with respect to that of the external clock signal; and a phase advance/delay signal generation unit, the phase advance/delay signal generating unit effective to selectively compare the internal clock signal and either one of the external clock signal and the output signal of the data output circuit to produce a phase advance/delay signal indicating whether the phase of the output signal of the data output circuit advances or delays with respect to the phase of the external clock signal;

the data output circuit includes a latch effective to latch input data in synchronization with the internal clock signal, and the phase advance/delay signal generation unit includes a similar impedance as that of the data output circuit and is effective to receive the external clock signal and to latch the external clock signal in synchronization with the internal clock signal.

8. A semiconductor device as recited in claim 7, wherein:

the delay adjustment circuit is effective to delay the input clock signal by change of a content held by a register or by disconnection of a fuse;

whereby when a tester is connected to monitor the phase advance/delay signal and the content held by the register is changed to obtain an appropriate delay time, the fuse may be disconnected so that a delay time of the semiconductor device can be fixed.

* * * * *